(12) United States Patent
Park et al.

(10) Patent No.: US 9,696,602 B2
(45) Date of Patent: Jul. 4, 2017

(54) MANUFACTURING METHOD OF LIQUID CRYSTAL DISPLAY

(71) Applicant: SAMSUNG DISPLAY CO., LTD., Yongin, Gyeonggi-Do (KR)

(72) Inventors: Kwang Bae Park, Suwon-si (KR); Young Woon Kho, Cheonan-si (KR); Yu Jun Kim, Asan-si (KR); Tae Ho Kim, Seoul (KR); Jong Kyun Park, Cheonan-si (KR); Ji Young Jeong, Cheonan-si (KR)

(73) Assignee: SAMSUNG ELECTRONICS CO., LTD., Yongin, Gyeonggi-Do (KR)

( * ) Notice: Subject to any disclaimer, the term of this patent is extended or adjusted under 35 U.S.C. 154(b) by 23 days.

(21) Appl. No.: 14/463,108

(22) Filed: Aug. 19, 2014

(65) Prior Publication Data

US 2015/0255327 A1    Sep. 10, 2015

(30) Foreign Application Priority Data

Mar. 5, 2014 (KR) .................. 10-2014-0026154

(51) Int. Cl.
*H01L 29/94* (2006.01)
*G02F 1/1362* (2006.01)
(Continued)

(52) U.S. Cl.
CPC ...... *G02F 1/136227* (2013.01); *H01L 27/124* (2013.01); *H01L 27/1288* (2013.01);
(Continued)

(58) Field of Classification Search
CPC ............. H01L 21/76804; H01L 27/124; H01L 27/1288; H01L 23/481; H01L 23/5384;
(Continued)

(56) References Cited

U.S. PATENT DOCUMENTS 6,979,643 B2 * 12/2005 Gustafsson ....... H01L 21/76838
257/750
9,064,750 B2 * 6/2015 Jeong .................... H01L 27/124
(Continued)

FOREIGN PATENT DOCUMENTS

JP     2009-271105    11/2009
KR    10-0476047     3/2005
(Continued)

OTHER PUBLICATIONS

Quirk & Serda, "Semiconductor Manufacturing Technology" p. 443. Published by Prentice-Hall, Inc. in 2001.*
(Continued)

*Primary Examiner* — Jesse Y Miyoshi
*Assistant Examiner* — Tuan A Hoang
(74) *Attorney, Agent, or Firm* — F. Chau & Associates, LLC

(57) ABSTRACT

A method for manufacturing a liquid crystal display includes: forming a first passivation layer and an organic layer, forming an edge of an inclined portion of the organic layer by partially removing the organic layer at a location where a first drain contact hole that exposes a drain electrode of a thin film transistor is formed, forming a second passivation layer including a third drain contact hole exposing the drain electrode, a first electrode including a second drain contact hole exposing the drain electrode, and the first drain contact hole through an etching process using one etching mask, and forming a second electrode on the second passivation layer. The first drain contact hole, the second drain contact hole, and the third drain contact hole overlap with each other, and a size of the second drain contact hole is greater than a size of the third drain contact hole.

19 Claims, 21 Drawing Sheets

(51) Int. Cl.
*H01L 27/12* (2006.01)
*G02F 1/1343* (2006.01)

(52) U.S. Cl.
CPC ............ *G02F 2001/134318* (2013.01); *G02F 2201/123* (2013.01)

(58) Field of Classification Search
CPC ......... H01L 29/41741; G02F 1/136227; G02F 2001/134318; G02F 2201/123
See application file for complete search history.

(56) References Cited

U.S. PATENT DOCUMENTS

| | | |
|---|---|---|
| 2012/0176561 A1 | 7/2012 | Kim et al. |
| 2012/0280237 A1* | 11/2012 | Kwack ................ H01L 27/1288 257/59 |
| 2013/0087794 A1 | 4/2013 | Kwack |
| 2013/0112979 A1 | 5/2013 | Nam et al. |

FOREIGN PATENT DOCUMENTS

| | | |
|---|---|---|
| KR | 10-2008-0075717 | 8/2008 |
| KR | 10-2011-0071313 | 6/2011 |
| KR | 10-2012-0113430 | 10/2012 |
| KR | 10-2013-0065246 | 6/2013 |

OTHER PUBLICATIONS

Quirk & Serda "Semiconductor Manufacturing Technology", p. 443. Published by Prentice-Hall, Inc. in 2001.*

* cited by examiner

MANUFACTURING METHOD OF LIQUID CRYSTAL DISPLAY

CROSS-REFERENCE TO RELATED APPLICATION

This application claims priority to Korean Patent Application No. 10-2014-0026154 filed on Mar. 5, 2014, the disclosure of which is hereby incorporated by reference herein in its entirety.

TECHNICAL FIELD

The present disclosure relates to a method for manufacturing a liquid crystal display.

DISCUSSION OF THE RELATED ART

A liquid crystal display, which is one of the most common types of flat panel displays currently in use, is a display device which rearranges liquid crystal molecules of a liquid crystal layer by applying voltages to electrodes to control an amount of transmitted light.

The liquid crystal display has a benefit of readily forming a thin film, but there may be a difficulty in that side visibility deteriorates compared with front visibility. To solve the above-mentioned difficulty, various types of alignments of the liquid crystal and driving methods have been developed. As a method for implementing a wide viewing angle, a liquid crystal display in which a pixel electrode and a common electrode are formed on one substrate has received attention.

In such a liquid crystal display, at least one of two field generating electrodes of the pixel electrode and the common electrode has a plurality of cutouts and a plurality of branch electrodes defined by the plurality of cutouts.

When two field generating electrodes are formed on one display panel, different photomasks may be required to form the respective field generating electrodes, and accordingly manufacturing costs may be increased.

SUMMARY

Embodiments of the present invention provide a method for manufacturing a liquid crystal display that can prevent an increase in manufacturing costs while forming two field generation electrodes on one display panel.

A method for manufacturing a liquid crystal display according to an exemplary embodiment of the present invention includes: forming a gate line and a data line on a first substrate and forming a thin film transistor connected to the gate line and the data line, forming a first passivation layer and an organic layer on the first substrate, forming an edge of an inclined portion of the organic layer by partially removing the organic layer at a location where a first drain contact hole that exposes a drain electrode of the thin film transistor is formed, forming a second passivation layer including a third drain contact hole exposing the drain electrode, a first electrode including a second drain contact hole exposing the drain electrode, and the first drain contact hole through an etching process using one etching mask, and forming a second electrode on the second passivation layer. The first drain contact hole, the second drain contact hole, and the third drain contact hole overlap with each other, and the size of the second drain contact hole is greater than a size of the third drain contact hole.

The edge of the inclined portion may be formed through an exposure process using one of a halftone mask or a slit mask.

The method may further include: depositing a first layer formed as a conductive layer on the first substrate after forming the edge of the inclined portion, depositing a second layer formed as an insulating layer on the first layer, and layering a photosensitive film on the second layer.

The first layer may be electrically separated from the drain electrode of the thin film transistor.

The method may further include forming a photosensitive film pattern by printing and developing the photosensitive film.

The photosensitive film pattern may be formed in an area corresponding to a location where the second passivation layer is formed.

The forming the second passivation layer may include dry-etching the second layer using the photosensitive film pattern as the etching mask.

The forming the first electrode may include wet-etching the first layer using the photosensitive film pattern as the etching mask.

The first layer may be less extended than the second edge of the second passivation layer due to over-etching of the first layer.

The forming the first drain contact hole may include dry-etching the partially remaining organic layer and the first passivation layer using the photosensitive film pattern as the etching mask.

An edge of the second drain contact hole and an edge of the third drain contact hole may be overlapped with the inclined portion of the organic layer.

The second electrode may be connected with the drain electrode through the first drain contact hole, the second drain contact hole, and the third drain contact hole.

A thickness of the second electrode may be greater than a thickness of the first electrode.

The thickness of the second electrode may be about two times greater than the thickness of the first electrode.

A first edge of the first electrode and a second edge of the second passivation electrode may have almost the same plane shape as each other.

The second edge of the second passivation layer may be protruded more than the first edge of the first electrode.

The first drain contact hole may be formed in the first passivation layer and exposes the drain electrode of the thin film transistor.

A size of the first drain contact hole may be smaller than the size of the second drain contact hole.

The size of the first drain contact hole may be smaller than the size of the third drain contact hole.

A method for manufacturing a liquid crystal display according to an exemplary embodiment of the present invention includes: forming a gate line including a gate electrode and a gate pad portion on a first substrate, forming a gate insulating layer on the gate line, forming a semiconductor on the gate insulating layer, forming a data line including a data pad portion, a source electrode, a drain electrode, and a gate signal transmission pad portion on the gate insulating layer, forming a first passivation layer and an organic layer on the first substrate where the data line, the drain electrode and the gate signal transmission pad portion are formed, performing an exposure process using a first mask to partially remove a portion of the organic layer at a location overlapping with the drain electrode to thereby form an edge of an inclined portion of the organic layer, performing an exposure process using the first mask to etch the organic layer, the first passivation layer and the gate insulating layer to thereby form a first pad contact hole exposing the gate pad portion, a second pad contact hole exposing the gate signal transmission pad portion, and a third pad contact hole exposing the data pad portion, forming a first layer formed as a transparent conductive layer on the edge of the inclined portion, in the first drain contact hole, in the first pad contact hole, in the second pad contact hole and in the third pad contact hole, forming a second layer as an insulating layer on the first layer, forming a photosensitive film pattern on the second layer, etching the second layer using the photosensitive film pattern as an etching mask to form a second passivation layer having a second edge and including a third drain contact hole, etching the first layer using the photosensitive film pattern to form a common electrode having a first edge which protrudes less than the second edge of the second passivation layer, and a connection member formed in the first pad contact hole contacting with the gate pad portion and in the second pad contact hole contacting with the gate signal transmission pad. The common electrode includes a second drain contact hole.

In addition, the method further includes etching the first passivation layer and the organic layer remaining in the area which overlaps the drain electrode to form a first drain contact hole exposing the drain electrode using the photosensitive film pattern, removing the photosensitive film pattern, and forming a pixel electrode on the second passivation layer and which is electrically connected to the drain electrode. The first drain contact hole, the second drain contact hole, and the third drain contact hole overlap with each other, and a size of the second drain contact hole is greater than a size of the third drain contact hole.

According to a liquid crystal display and manufacturing method thereof of exemplary embodiments of the present invention, two field generating electrodes are formed on one display panel such that an increase in the manufacturing costs can be prevented.

BRIEF DESCRIPTION OF THE DRAWINGS

Exemplary embodiments of the present invention can be understood in more detail from the following detailed description when taken in conjunction with the attached drawings in which.

DETAILED DESCRIPTION OF EXEMPLARY EMBODIMENTS

Figure 1:
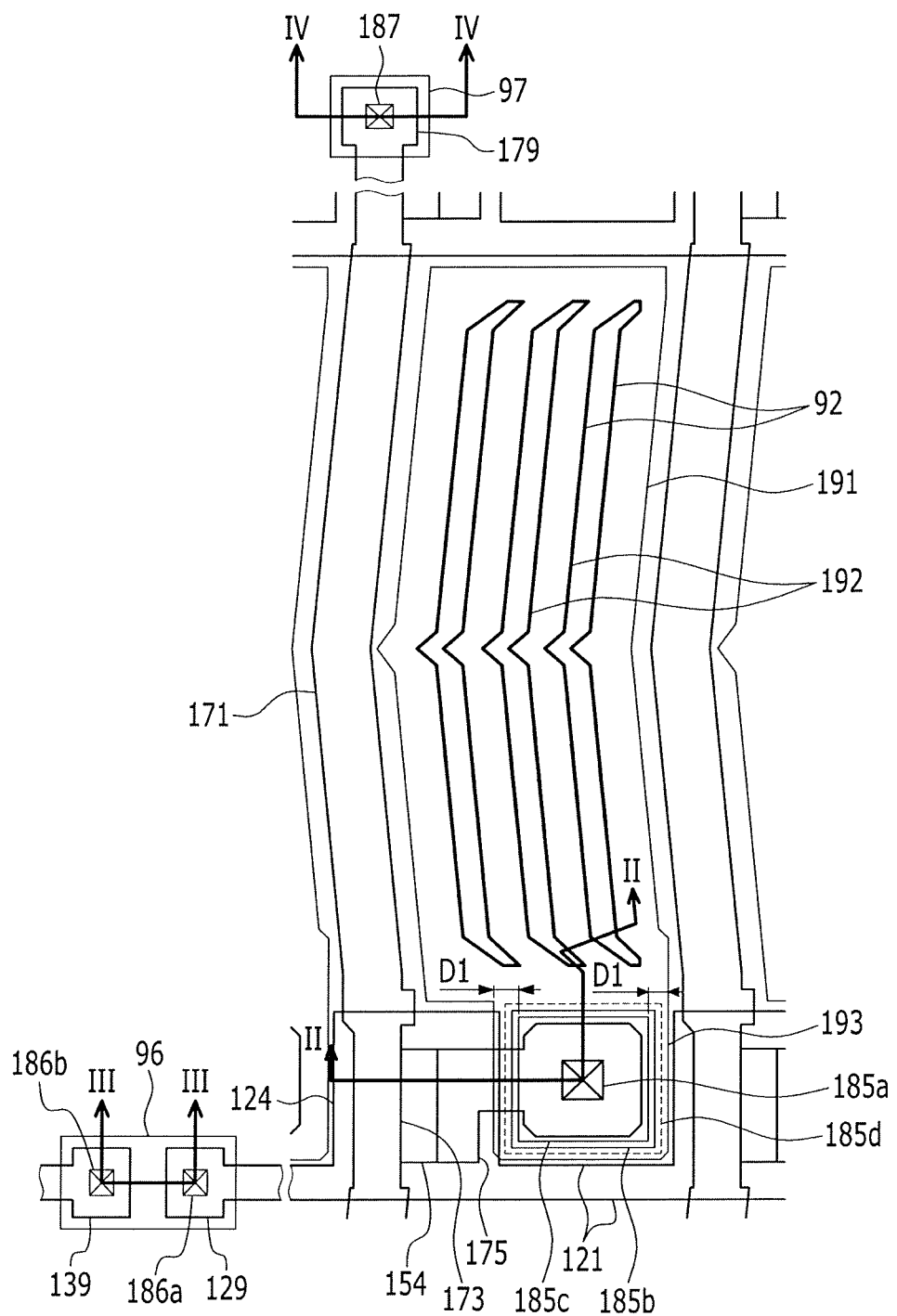
FIG. 1 is a layout view of a liquid crystal display according to an exemplary embodiment of the present invention.

Exemplary embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc. may be exaggerated for clarity. Like reference numerals designate like elements throughout the specification. It will be understood that when an element such as a layer, film, region, or substrate is referred to as being "on" another element, it can be directly on the other element or intervening elements may also be present.

As used herein, the singular forms, "a", "an", and "the" are intended to include plural forms as well, unless the context clearly indicates otherwise.

Now, a liquid crystal display according to an exemplary embodiment of the present invention will be described with reference to the accompanying drawings.

Figure 2:
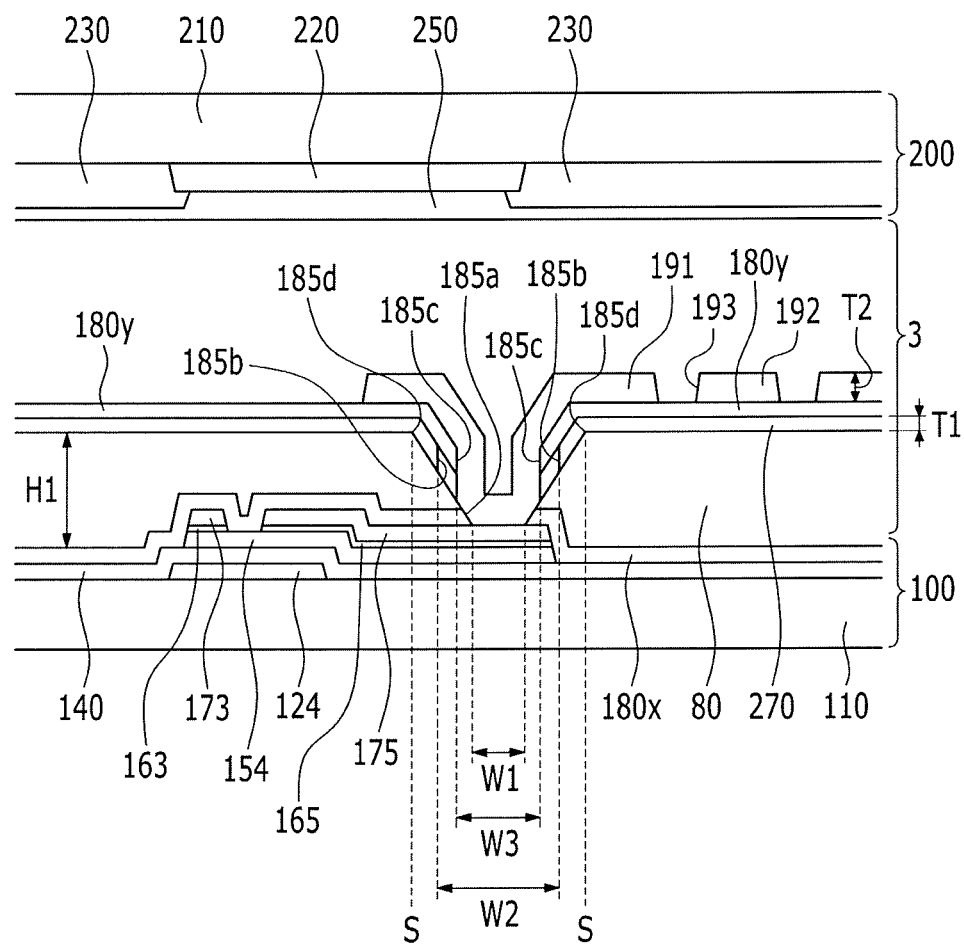
FIG. 2 is a cross-sectional view of the liquid crystal display of FIG. 1, taken along the line II-II.
Figure 3:
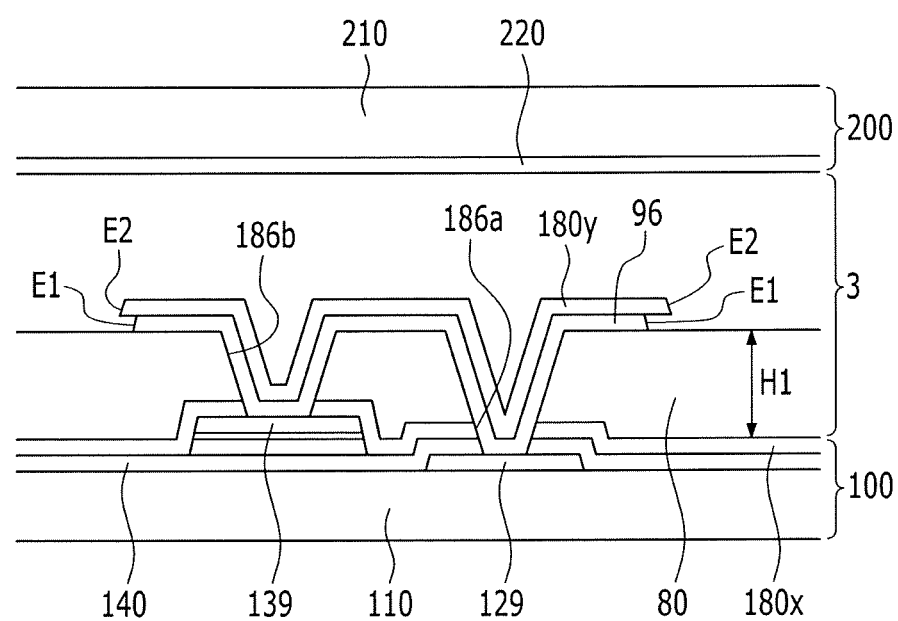
FIG. 3 is a cross-sectional view of the liquid crystal display of FIG. 1, taken along the line III-III.
Figure 4:
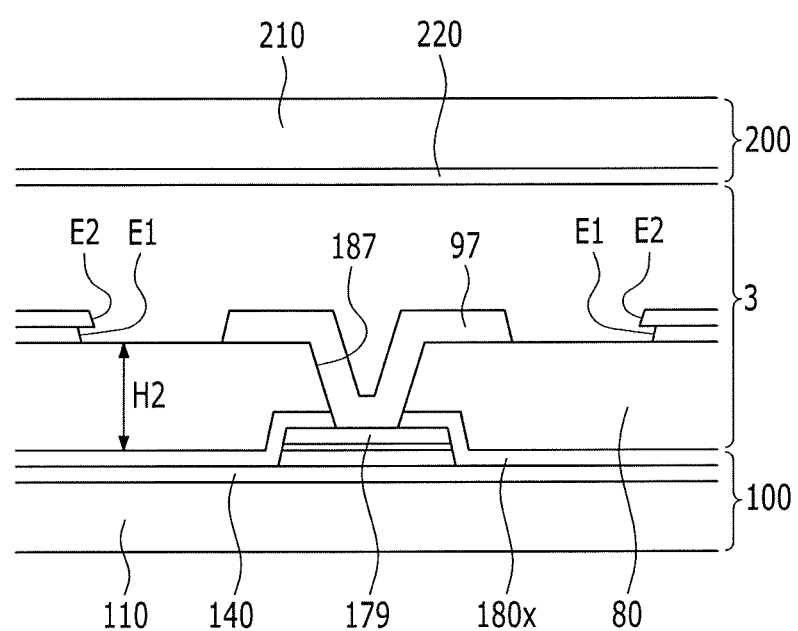
FIG. 4 is a cross-sectional view of the liquid crystal display of FIG. 1, taken along the line IV-IV.

First, referring to FIG. 1 to FIG. 4, a liquid crystal display according to an exemplary embodiment of the present invention will be described. FIG. 1 is a layout view of a liquid crystal display according to an exemplary embodiment of the present invention. FIG. 2 is a cross-sectional view of the liquid crystal display of FIG. 1, taken along the line II-II. FIG. 3 is a cross-sectional view of the liquid crystal display of FIG. 1, taken along the line III-III. FIG. 4 is a cross-sectional view of the liquid crystal display of FIG. 1, taken along the line IV-IV.

Referring to FIG. 1 to FIG. 4, the liquid crystal display according to the present exemplary embodiment of the present invention includes a lower panel 100 and an upper panel 200 that face each other, and a liquid crystal layer 3 injected between the lower and upper panels 100 and 200.

First, the lower panel 100 will be described.

A gate conductor including gate lines 121 is formed on a first substrate 110 formed of transparent glass, quartz or plastic. Further, in an exemplary embodiment, the first substrate 110 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof.

The gate line 121 includes a wide gate pad portion 129 so as to be connected with a gate electrode 124 and other layers or an external driving circuit. The gate line 121 may be formed of, for example, an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). Alternatively, the gate line 121 may have, for example, a multilayer structure which includes at least two conductive layers having different physical properties.

A gate insulating layer 140 which is formed of, for example, a silicon nitride ($SiN_x$), a silicon oxide ($SiO_x$), silicon oxynitride (SiOxNy), aluminum oxide (AlOx), yttrium oxide ($Y_2O_3$), hafnium oxide (HfOx), zirconium oxide (ZrOx), aluminum nitride (AlN), aluminum oxynitride (AlNO), titanium oxide (TiOx), barium titanate (BaTiO3), lead titanate ($PbTiO_3$), or a combination thereof is formed on the gate conductors (gate line 121, gate electrode 124, and gate pad portion 129). The gate insulating layer 140 may have, for example, a multilayer structure including at least two insulating layers having different physical properties.

A semiconductor 154 made of, for example, amorphous silicon, polysilicon, or the like is formed on the gate insulating layer 140. The semiconductor 154 may include, for example, an oxide semiconductor. For example, the oxide semiconductor can be made of an oxide material including indium, zinc, tin, gallium, lead, germanium, cadmium, or an oxide compound thereof, such as indium gallium zinc oxide, indium zinc oxide and zinc tin oxide, but exemplary embodiments are not limited thereto.

Ohmic contacts 163 and 165 are positioned on the semiconductor 154. The ohmic contacts 163 and 165 may be made of a material such as, for example, n+ hydrogenated amorphous silicon in which an n-type impurity such as phosphorus is doped at a high concentration, or of a silicide. The ohmic contacts 163 and 165 may be disposed on the semiconductor 154 as a pair. In the case that the semiconductor 154 is an oxide semiconductor, the ohmic contacts 163 and 165 may be omitted.

A data conductor including a data line 171 including a source electrode 173 and a drain electrode 175 is positioned on the ohmic contacts 163 and 165 and the gate insulating layer 140.

The data line 171 includes a data pad portion 179 for connection with another layer or an external driving circuit. The data line 171 transfers a data signal, and mainly extends in a vertical direction to cross the gate line 121.

In this case, the data line 171 may have, for example, a first curved portion having a curved shape to acquire maximum transmittance of the liquid crystal display, and the curved portion may have a V-letter shape which meets in a middle region of the pixel area. In addition, the data line 171 may further include, for example, a second curved portion in the middle region of the pixel area which is curved to form a predetermined angle with the first curved portion.

The source electrode 173 is, for example, a part of the data line 171, and is disposed on the same line as the data line 171. The drain electrode 175 is formed to extend in parallel with the source electrode 173. Accordingly, the drain electrode 175 is parallel with part of the data line 171.

The gate electrode 124, the source electrode 173, and the drain electrode 175 form one thin film transistor (TFT) together with the semiconductor 154, and a channel of the thin film transistor is positioned in the semiconductor 154 between the source electrode 173 and the drain electrode 175.

The liquid crystal display according to the present exemplary embodiment of the present invention includes, for example, the source electrode 173 positioned on the same line as the data line 171 and the drain electrode 175 extending in parallel with the data line 171, and as a result, a width of the thin film transistor may be increased while an area occupied by the data conductor is not increased to thereby increase an aperture ratio of the liquid crystal display.

However, alternatively in an exemplary embodiment of the present invention, the source electrode 173 and the drain electrode 175 may have, for example, different shapes.

The data line 171 and the drain electrode 175 may be made of, for example, a refractory metal such as molybdenum, chromium, tantalum, and titanium, or an alloy thereof, and may have a multilayered structure including a refractory metal layer and a low resistive conductive layer. Examples of the multilayered structure may include but are not limited to a double layer of a chromium or molybdenum (alloy) lower layer and an aluminum (alloy) upper layer, and a triple layer of a molybdenum (alloy) lower layer, an aluminum (alloy) middle layer, and a molybdenum (alloy) upper layer. However, the data line 171 and the drain electrode 175 may be formed of various other metals or conductors.

A gate signal transmission pad portion 139 formed on, for example, the same layer as that of the data line 171, and is formed in a portion that is adjacent to the gate pad portion 129.

The gate signal transmission pad portion 139 transmits a gate signal received from the gate driver to the gate line 121 through the gate pad portion 129.

A first passivation layer 180x is positioned on the data conductor, the gate insulating layer 140, and an exposed portion of the semiconductor 154. The first passivation layer 180x may be made of, for example, an organic insulating material or an inorganic insulating material.

An organic layer 80 is disposed on the first passivation layer 180x. For example, the thickness of the organic layer 80 is greater than the thickness of the first passivation layer 180x, and it may have a flat surface.

A first thickness H1 of the organic layer 80 located in a display area where a plurality of pixels are provided for displaying an image may be greater than a second thickness H2 of the organic layer 80 located in an area where the data pad portion 179 is provided.

Alternatively, in an exemplary embodiment of the present invention, the organic layer 80 may be omitted. In an exemplary embodiment, the organic layer 80 may be, for example, a color filter, and in this case, a layer disposed on the organic layer 80 may be further included. For example, a capping layer may be further provided on the color filter to prevent permeation of a pigment of the color filter into a liquid crystal layer, and the capping layer may be made of, for example, an insulation material such as a silicon nitride ($SiN_x$).

The organic layer 80 and the first passivation layer 180x include a first drain contact hole 185a that partially exposes the drain electrode 175. The organic layer 80, the first passivation layer 180x, and the gate insulating layer 140 include a first pad contact hole 186a exposing the gate pad portion 129, and the organic layer 80 and the first passivation layer 180x include a second pad contact hole 186b exposing the gate signal transmission pad portion 139. In addition, the organic layer 80 and the first passivation layer 180x include a third pad contact hole 187 exposing the data pad portion 179.

A common electrode 270 is formed on the organic layer 80. The common electrode 270 having, for example, a planar shape may be formed on the entire surface of the first substrate 110 as a whole plate, and includes a second drain contact hole 185b formed in an area corresponding to the periphery of the drain electrode 175.

Common electrodes 270 which are disposed in adjacent pixels are connected to each other so that a common voltage having a predetermined magnitude supplied from the outside of the display area is transmitted thereto.

A connection member 96 is formed on the first pad contact hole 186a and the second pad contact hole 186b that expose the gate pad portion 129 and the gate signal transmission pad portion 139, respectively.

The connection member 96 connects the gate pad portion 129 and the gate signal transmission pad portion 139 that are exposed by the first pad contact hole 186a and the second pad contact hole 186b to each other. The gate signal transmitted to the gate signal transmission pad portion 139 is transmitted to the gate pad portion 129 so that the gate signal is transmitted to the gate line 121 connected to the gate pad portion 129.

The connection member 96 is formed at the same layer as the common electrode 270. The common electrode 270 and the connection member 96 are made of, for example, transparent conductive layers such as indium tin oxide (ITO), indium zinc oxide (IZO), aluminum zinc oxide (AZO), cadmium tin oxide (CTO), or a combination thereof.

A second passivation layer 180y is formed on the common electrode 270 and the connection member 96.

The second passivation layer 180y may be made of, for example, an organic insulating material or an inorganic insulating material.

The second passivation layer 180y includes a third drain contact hole 185c formed in an area corresponding to the drain electrode 175.

The common electrode 270 and the second passivation layer 180y have, for example, almost the same plane shape as each other. In further detail, viewed from the top of the liquid crystal display, the shape formed by the edge of the common electrode 270 and the shape formed by the edge of the second passivation layer 180y are almost equivalent to each other.

The size and the width of the second drain contact hole 185b of the common electrode 270 are greater than the size and the width of the third drain contact hole 185c of the second passivation layer 180y.

A second edge E2 of the second passivation layer 180y is protruded more than a first edge E1 of the common electrode 270. In further detail, viewed from the top of the liquid crystal display, the second edge E2 of the second passivation layer 180y is expanded more than the first edge E1 of the common electrode 270.

The second passivation layer 180y and the common electrode 270 are provided in the display area where the plurality of pixels are provided, and may not be provided in the peripheral area where the gate pad portion 129 and the data pad portion 179 are provided.

In the present exemplary embodiment, the connection member 96 formed on the gate pad portion 129 and the gate signal transmission pad portion 139 is formed on the same layer as that of the common electrode 270, but, like a contact auxiliary member 97, the connection member 96 may be formed on the same layer as that of the pixel electrode 191.

The pixel electrode 191 is formed on the second passivation layer 180y. The pixel electrode 191 includes, for example, a curved edge that is almost parallel with a first curved portion and a second curved portion of the data line 171. The pixel electrode 191 includes, for example, a plurality of cutouts 92 and a plurality of branch electrodes 192 respectively defined by the plurality of cutouts 91.

The pixel electrode 191 includes, for example, an expansion portion 193 expanded toward the drain electrode 175, and the expansion portion 193 of the pixel electrode 191 is physically and electrically connected with the drain electrode 175 through the first drain contact hole 185a, the second drain contact hole 185b, and the third drain contact hole 185c to receive a data voltage from the drain electrode 175.

The contact auxiliary member 97 is formed on the data pad portion 179 exposed by the third pad contact hole 187. The contact auxiliary member 97 supplements adhesion between the data pad portion 179 and an external device, and protects them.

The pixel electrode 191 and the contact auxiliary members 97 are made of, for example, transparent conductive layers such as indium tin oxide (ITO), indium zinc oxide (IZO), aluminum zinc oxide (AZO), cadmium tin oxide (CTO), or a combination thereof. The pixel electrode 191 and the contact auxiliary members 97 are thicker than the common electrode 270 and the connection member 96. In further detail, a fourth thickness T2 of the pixel electrode 191 is greater than a third thickness T1 of the common electrode 270, and the fourth thickness T2 may be, for example, about two times or more the third thickness T1. For example, the pixel electrode 191 and the contact auxiliary members 97 may have a thickness of about 900 Å.

In addition, a first alignment layer is coated on the pixel electrode 191 and the second passivation layer 180y that is not covered by the pixel electrode 191, and the first alignment layer may be a horizontal alignment layer rubbed in a predetermined direction. However, alternatively in a liquid crystal display according to an exemplary embodiment of the present invention, the first alignment layer may include, for example, a photoactive material and thus may be photoaligned.

Now, the upper panel 200 will be described.

A light blocking member 220 is formed on a second substrate 210 made of, for example, transparent glass, quartz or plastic. Further, in an exemplary embodiment, the second substrate 210 may be, for example, a flexible substrate. Suitable materials for the flexible substrate include, for example, polyethersulfone (PES), polyethylenenaphthalate (PEN), polyethylene (PE), polyimide (PI), polyvinyl chloride (PVC), polyethylene terephthalate (PET), or combinations thereof. The light blocking member 220 is also called a black matrix, and blocks light leakage.

In addition, a plurality of color filters 230 are formed on the second substrate 210.

An overcoat 250 is formed on the color filter 230 and the light blocking member 220. The overcoat 250 may be made of, for example, an (organic) insulation material, and prevents the color filters 230 from being exposed and provides a flat surface. Alternatively, the overcoat 250 may be omitted.

In addition, a second alignment layer is coated on the overcoat 250, and the second alignment layer may be a vertical alignment layer rubbed in a predetermined direction. However, alternatively in an exemplary embodiment of the present invention, the second alignment layer may include, for example, a photoactive material and thus may be photo-aligned.

The liquid crystal layer 3 includes, for example, a nematic liquid crystal material having positive dielectric anisotropy. The long-axial direction of liquid crystal molecules of the liquid crystal layer 3 may be arranged in parallel with the lower and upper display panels 100 and 200.

The pixel electrode 191 receives the data voltage from the drain electrode 175, and the common electrode 270 receives a common voltage having a predetermined magnitude from a common voltage applying portion provided outside of the display area.

The pixel electrode 191 and the common electrode 270, which are field generating electrodes, generate an electric field such that the liquid crystal molecules of the liquid crystal layer 3 provided on the two electrodes (pixel electrode 191 and common electrode 270) rotate in a direction that is parallel with a direction of the electric field. As described above, according to the determined rotation direction of the liquid crystal molecules, polarization of light passing through the liquid crystal layer is changed.

The common electrode 270 and the second passivation layer 180y formed on the common electrodes 270 have substantially the same plane shape as each other. Thus, the second passivation layer 180y and the common electrode 270 may be formed together using one photomask.

Accordingly, an increase in the manufacturing costs of the liquid crystal display can be prevented.

Now, the drain contact portion of a liquid crystal display according to an exemplary embodiment of the present invention will be described in further detail.

The organic layer 80, the first passivation layer 180x, and the gate insulating layer 140 include the first drain contact hole 185a. The common electrode 270 includes the second drain contact hole 185b, and the second passivation layer 180y includes the third drain contact hole 185c.

The first drain contact hole 185a, the second drain contact hole 185b, and the third drain contact hole 185c at least partially overlap with each other.

The drain electrode 175 exposed through the overlapped portion is connected with the pixel electrode 191.

A first size and a first width W1 of the first drain contact hole 185a are smaller than a second size and a second width W2 of the second drain contact hole 185b. In addition, the first size and the first width W1 of the first drain contact hole 185a are smaller than a third size and a third width W3 of the third drain contact hole 185c. Further, the second size and the second width W2 of the second drain contact hole 185b are greater than the third size and the third width W3 of the third drain contact hole 185c. That is, the sizes and the widths of the first drain contact hole 185a, the third drain contact hole 185c, and the second drain contact hole 185b are increased in that order.

As the second size and the second width W2 of the common electrode 270 formed in the second drain contact hole 185b are greater than the third size and the third width W3 of the third drain contact hole 185c formed in the second passivation layer 180y, the second edge E2 of the second passivation layer 180y protrudes more than the first edge E1 of the common electrode 270. Thus, the pixel electrode 191 formed above the second passivation layer 180y can be prevented from being connected with the common electrode 270 formed below the second passivation layer 180y.

Referring to FIG. 1, the size and the width of an edge 185d of an inclined portion where the first drain contact hole 185a is formed are wider than the second size and the second width W2 of the second drain contact hole 185b and the third size and the third width W3 of the third drain contact hole 185c.

That is, the second drain contact hole 185b of the common electrode 270 and the third drain contact hole 185c of the second passivation layer 180y are provided in an inclined portion S of the first drain contact hole 185a formed in the organic layer 80. Accordingly, a short circuit of the pixel electrode 191 due to a step formed in a contact portion by the third drain control hole 185c protruded more than the second drain contact hole 185b can be prevented. In addition, as previously described, a fourth thickness T2 of the pixel electrode 191 is about two times that of a third thickness T3 of the common electrode 270, and therefore a short circuit of the pixel electrode 191 due to a step formed in a contact portion by the third drain contact hole 185c that is protruded more than the second drain contact hole 185b can be prevented.

As the fourth thickness T2 of the pixel electrode 191 is thick, a distance D1 between the third drain contact hole 185c and an edge of the expansion portion 193 of the pixel electrode 191 is almost equal to the fourth thickness T2 of the pixel electrode 191.

As described, in the liquid crystal display according to the present exemplary embodiment of the present invention, the second passivation layer 180y and the common electrode 270 are formed together using one photomask, and thus an increase in the manufacturing costs of the liquid crystal display can be prevented and a short circuit of the pixel electrode 191 due to a step of the second passivation layer 180y and the common electrode 270 in the drain contact portion can be prevented.

Figure 5:
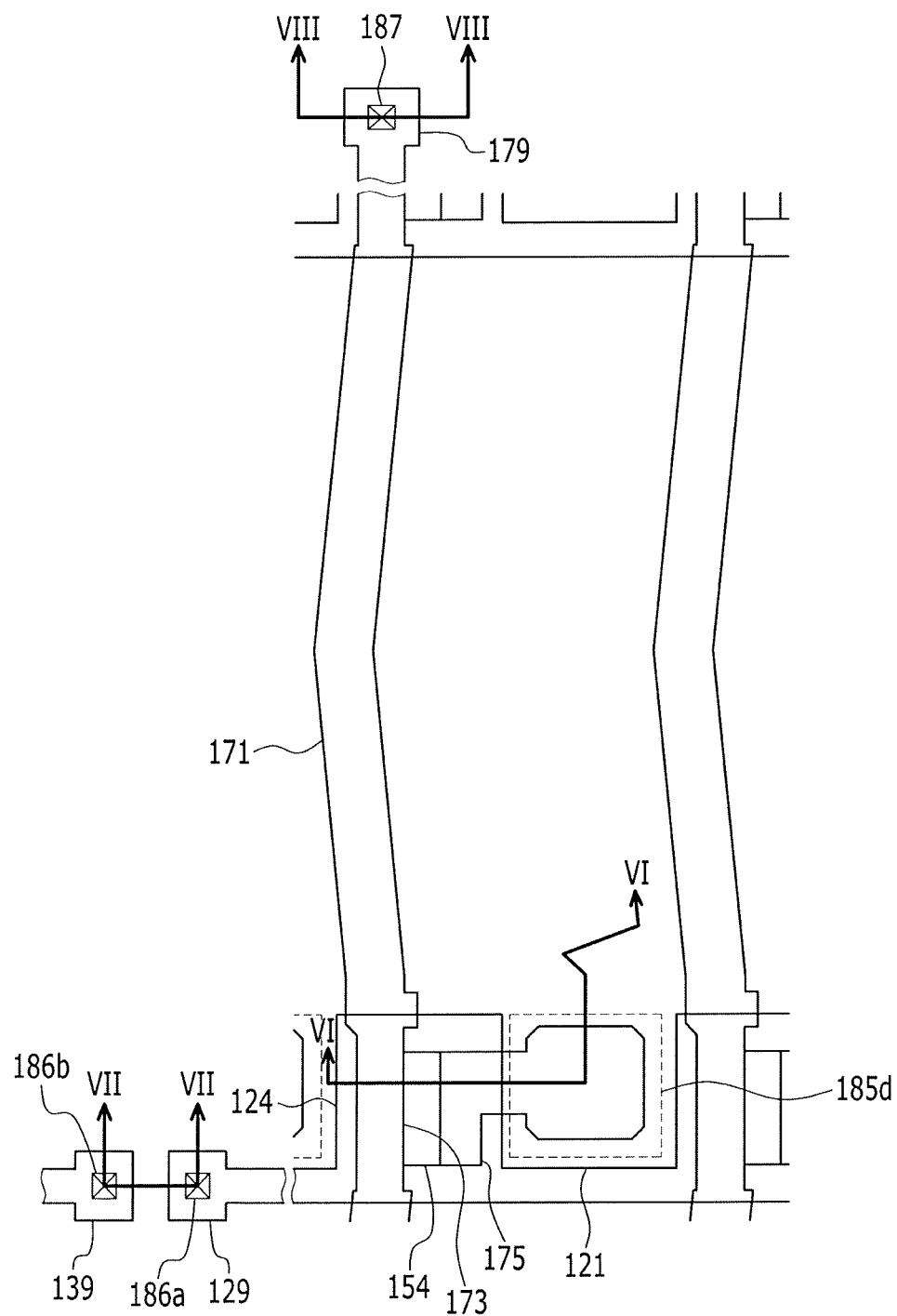
FIG. 5 is a layout view of a manufacturing process of a liquid crystal display according to an exemplary embodiment of the present invention.
Figure 6:
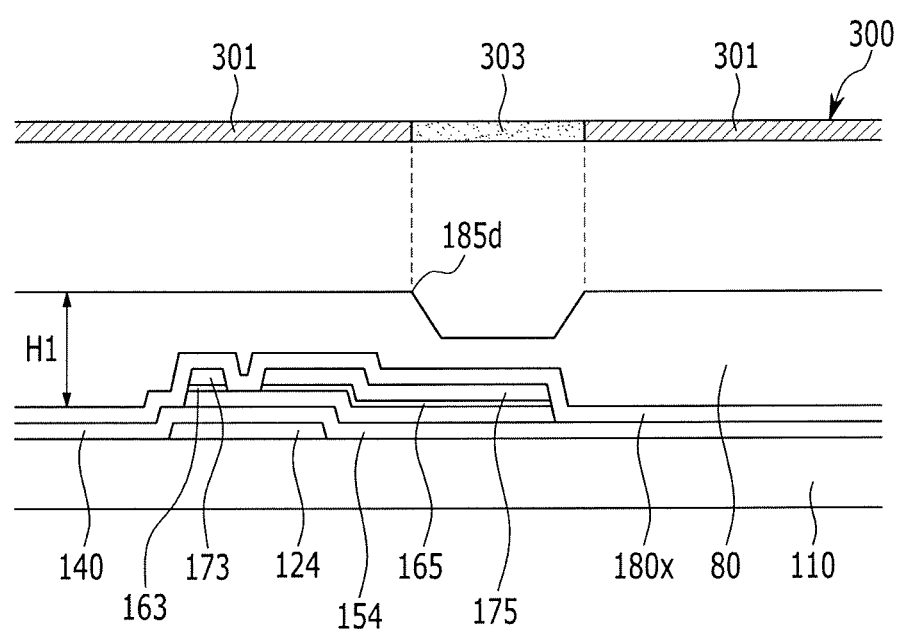
FIG. 6 is a cross-sectional view of the manufacturing process of the liquid crystal display taken along the line VI-VI of FIG. 5.
Figure 7:
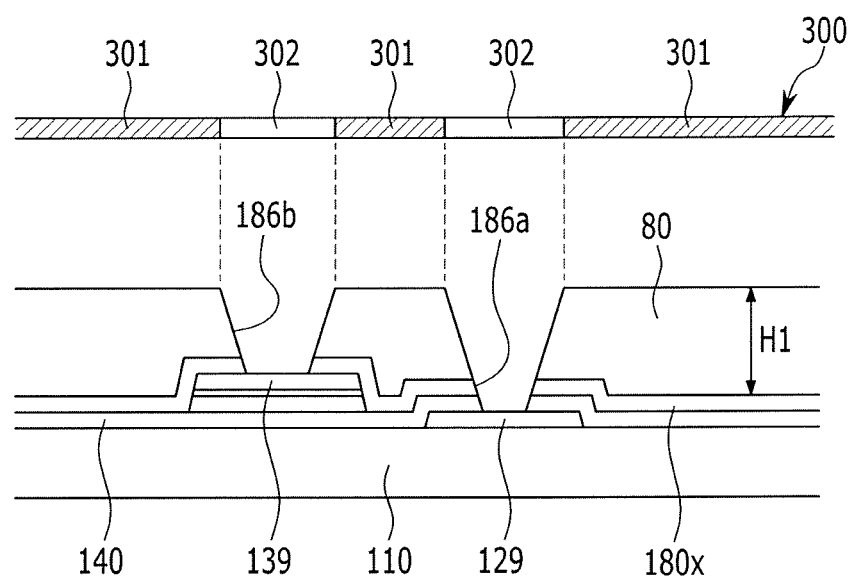
FIG. 7 is a cross-sectional view of the manufacturing process of the liquid crystal display taken along the line VII-VII of FIG. 5.
Figure 8:
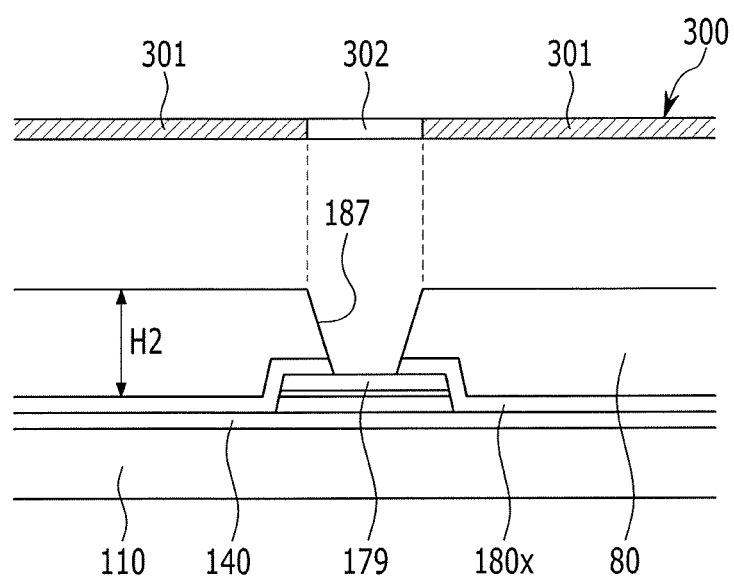
FIG. 8 is a cross-sectional view of the manufacturing process of the liquid crystal display taken along the line VIII-VIII of FIG. 5.
Figure 9:
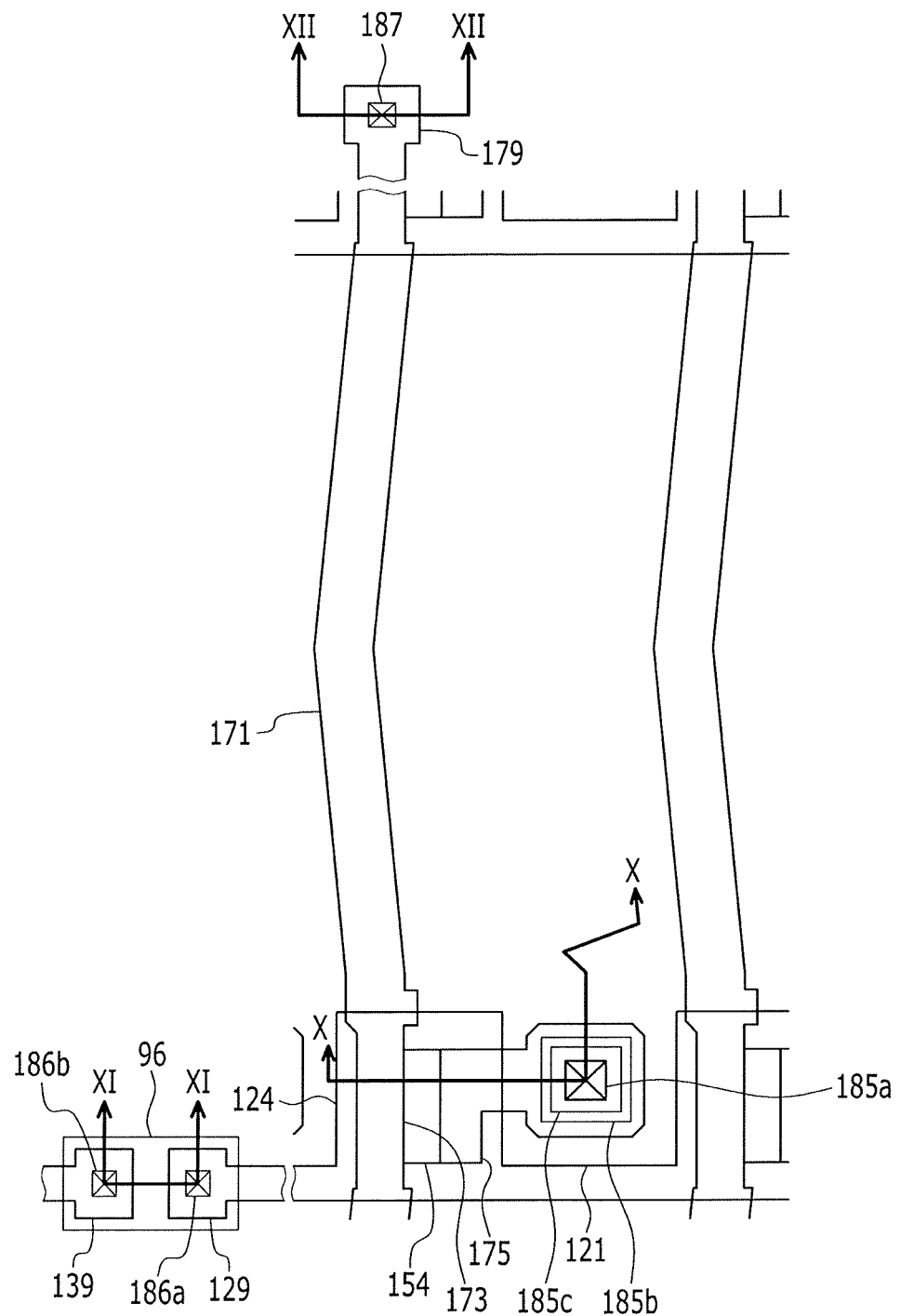
FIG. 9 is a layout view of a manufacturing process of a liquid crystal display according to an exemplary embodiment of the present invention.
Figure 10:
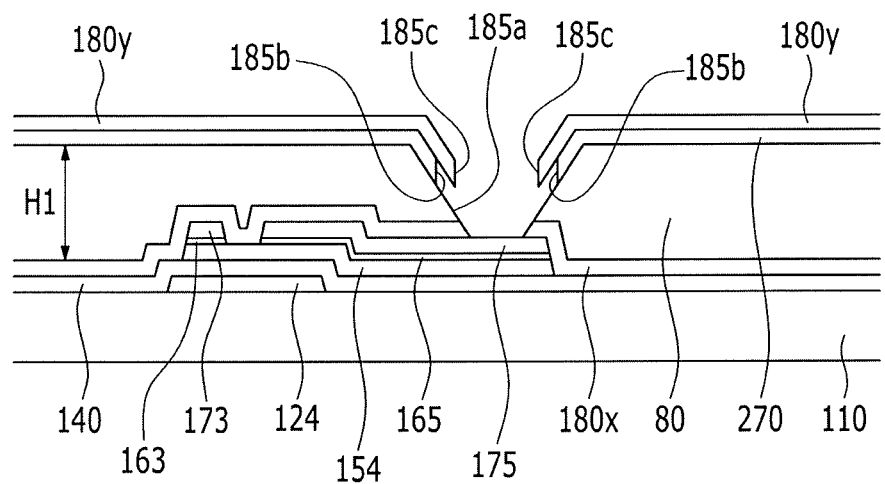
FIG. 10 is a cross-sectional view of the manufacturing process of the liquid crystal display taken along the line X-X of FIG. 9.
Figure 11:
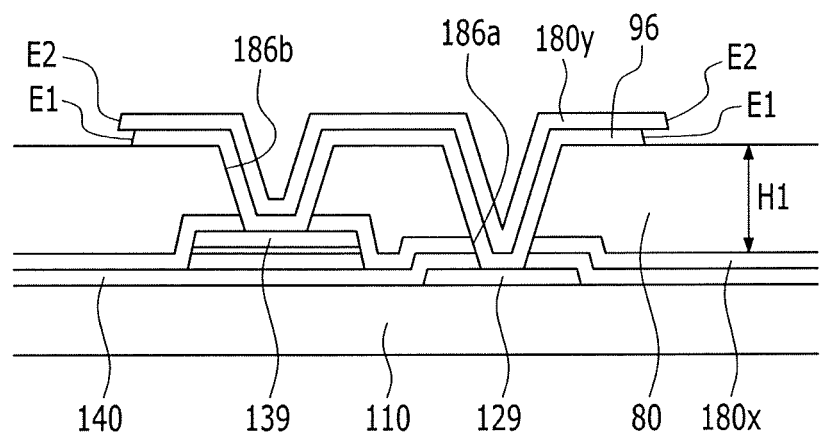
FIG. 11 is a cross-sectional view of the manufacturing process of the liquid crystal display taken along the line XI-XI of FIG. 9.
Figure 12:
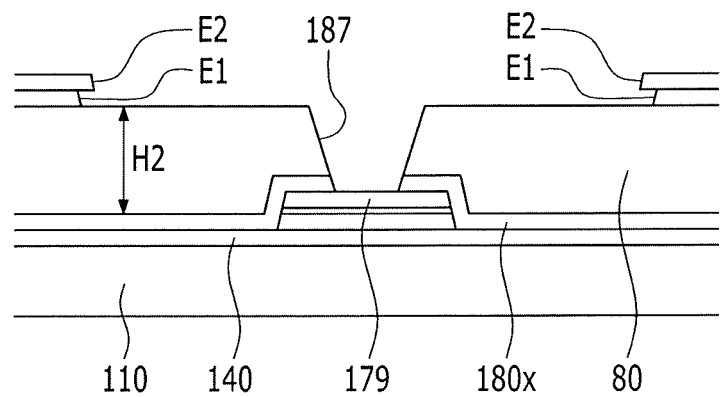
FIG. 12 is a cross-sectional view of the manufacturing process of the liquid crystal display taken along the line XII-XII of FIG. 9.

Now, a manufacturing method of a liquid crystal display according to an exemplary embodiment of the present invention will be described with reference to FIG. 5 to FIG. 27, together with FIG. 1 to FIG. 4. FIG. 5 is a layout view of a manufacturing process of a liquid crystal display according to an exemplary embodiment of the present invention. FIG. 6 is a cross-sectional view of the manufacturing process of the liquid crystal display taken along the line VI-VI of FIG. 5. FIG. 7 is a cross-sectional view of the manufacturing process of the liquid crystal display taken along the line VII-VII of FIG. 5. FIG. 8 is a cross-sectional view of the manufacturing process of the liquid crystal display taken along the line VIII-VIII of FIG. 5. FIG. 9 is a layout view of a manufacturing process of a liquid crystal display according to an exemplary embodiment of the present invention. FIG. 10 is a cross-sectional view of the manufacturing process of the liquid crystal display taken along the line X-X of FIG. 9. FIG. 11 is a cross-sectional view of the manufacturing process of a liquid crystal display taken along the line XI-XI of FIG. 9. FIG. 12 is a cross-sectional view of the manufacturing process of the liquid crystal display taken along the line XII-XII of FIG. 9. FIG. 13 to FIG. 27 are cross-sectional views that sequentially illustrate a manufacturing process of a liquid crystal display according to an exemplary embodiment of the present invention.

Referring to FIG. 5 to FIG. 8, the gate line 121 including the gate electrode 124 and the gate pad portion 129 is formed on the first substrate 110, and the gate insulating layer 140 is formed on the gate line 121. The semiconductor 154, the ohmic contacts 163 and 165, the data line 171 including the source electrode 173 and the data pad portion 179, the drain electrode 175, and the gate signal transmission pad portion 139 are formed on the gate insulating layer 140. The first passivation layer 180x and the organic layer 80 are formed on the first substrate 110 where the data line 171, the drain electrode 175, and the gate signal transmission pad portion 139 are formed.

The organic layer 80 may be, for example, a color filter. Here, a first thickness H1 of the organic layer 80 located in the display area where the plurality of pixels are provided to display an image may be greater than a second thickness H2 of the organic layer 80 located in the peripheral area where the data pad portion 179 is formed.

An exposure process is performed to eliminate the organic layer 80 in a location where the first drain contact hole 185a, the first pad contact hole 186a, the second pad contact hole 186b, and the third pad contact hole 187 are formed. In this case, a mask 300 used in the exposure process may be, for example, a halftone photo-mask or a slit mask. The mask 300 includes, for example, a blocking area 301 that blocks light and a transflective area 303 through which light is partially reflected and partially passes. Here, it is assumed that a portion exposed to the light in the organic layer 80 is made of, for example, a positive photo-resistive material that is washed away by a developer. The transflective area 303 is provided in an upper portion of the organic layer 80 where the first drain contact hole 185a is provided, and a transmissive area 302 is provided in an upper portion of the organic layer 80 where the first pad contact hole 186a, the second pad contact hole 186b, and the third pad contact hole 187 are provided. Through the exposure process, the organic layer 80 at the location where the first drain contact hole 185a is formed partially remains, and the organic layer 80 at the location where the first pad contact hole 186a, the second pad contact hole 186b, and the third pad contact hole 187 are formed is completely removed. If a portion of the organic layer 80 which is not exposed to light is made of a negative photo-resistive material that is washed away by the developer, a mask of which a location of the light blocking area 301 and the transmissive area 302 are opposite to each other may alternatively be used.

The first passivation layer 180x and the gate insulating layer 140 exposed by complete removal of the organic layer 80 are etched so as to form the first pad contact hole 186a exposing the gate pad portion 129, the second pad contact hole 186b exposing the gate signal transmission pad portion 139, and the third pad contact hole 187 exposing the data pad portion 179.

The organic layer 80 partially remains in the location where the first drain contact hole 185a is formed so that the edge 185d of the inclined portion is formed. That is, the first passivation layer 180x is not etched and the drain electrode 175 is not exposed due to the organic layer 80 remaining in the location where the first drain contact hole 185a is formed.

Next, as shown in FIG. 9 to FIG. 12, the common electrode 270, the connection member 96, and the second passivation layer 180y are formed together. As previously described, the shape formed by the edge of the common electrode 270 and the shape formed by the edge of the second passivation layer 180y are almost equivalent to each other, and the second edge E2 of the second passivation layer 180y is expanded more than the first edge E1 of the common electrode 270.

Now, a method for forming the common electrode 270, the connection member 96, and the second passivation layer 180y together will be described with reference to FIG. 13 to FIG. 30. FIG. 13 to FIG. 30 are cross-sectional views that sequentially illustrate a manufacturing process of a liquid crystal display according to an exemplary embodiment of the present invention.

Figure 13:
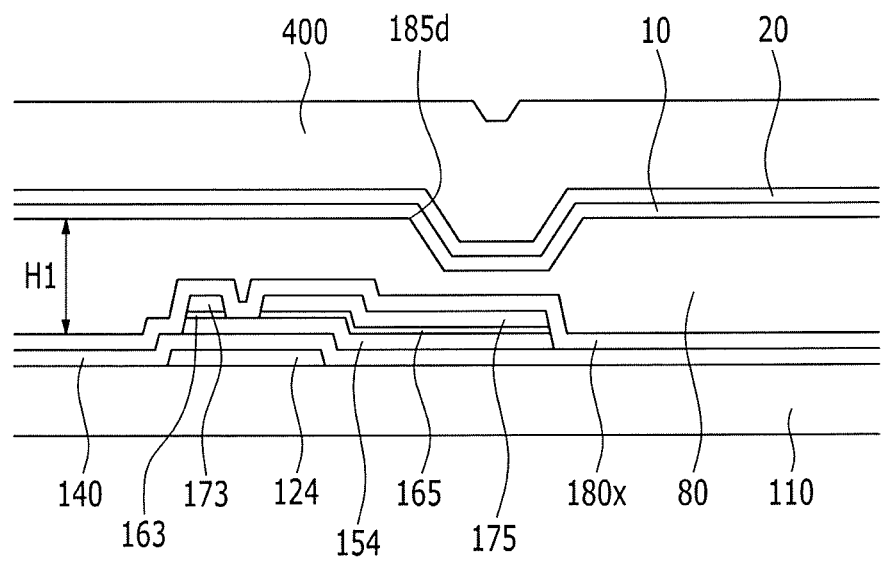
FIG. 13 to FIG. 30 sequentially illustrate a manufacturing method of a liquid crystal display according to an exemplary embodiment of the present invention.
Figure 14:
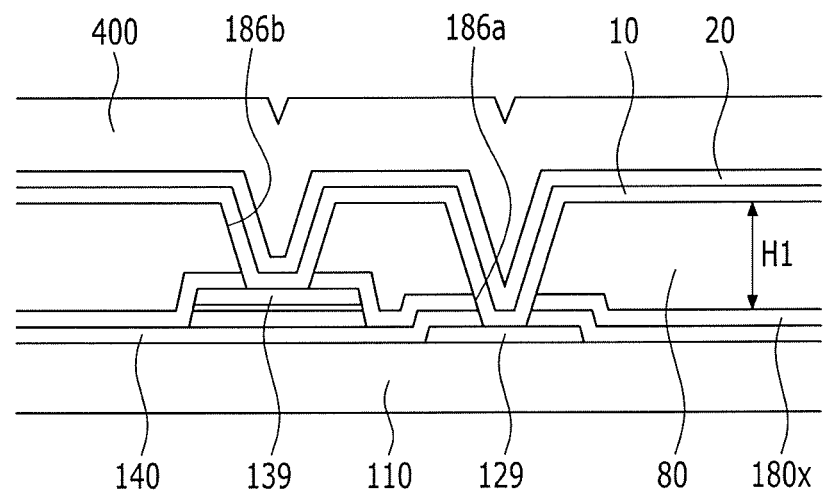
Figure 15:
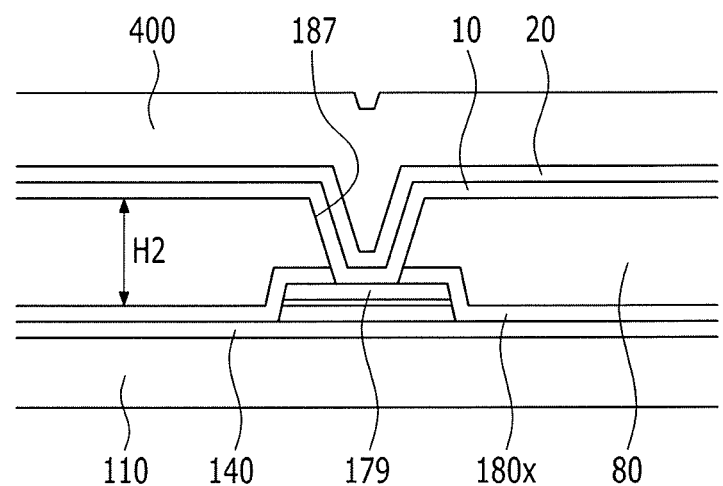

Referring to FIG. 13 to FIG. 15, a first layer 10 formed as a transparent conductive layer is deposited on the edge 185d of the inclined portion and in the first drain contact hole 185a. Further, the first layer 10 is also deposited in the first pad contact hole 186a, the second pad contact hole 186b, and the third pad contact hole 187. In addition, a second layer 20 formed as an insulating layer is deposited to the first layer 10. After that, a photosensitive film 400 is layered on the second layer 20. The first layer 10 is electrically separated from the drain electrode 175 by the remaining organic layer 80.

Figure 16:
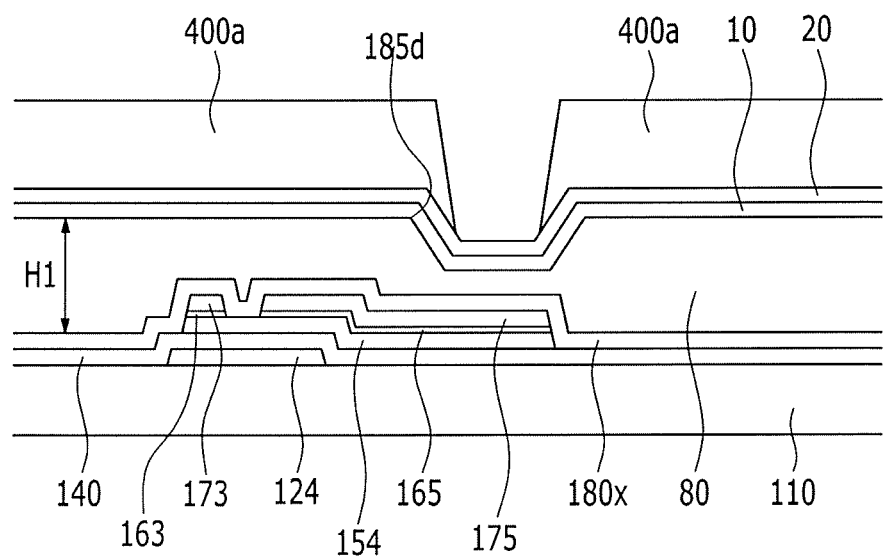
Figure 17:
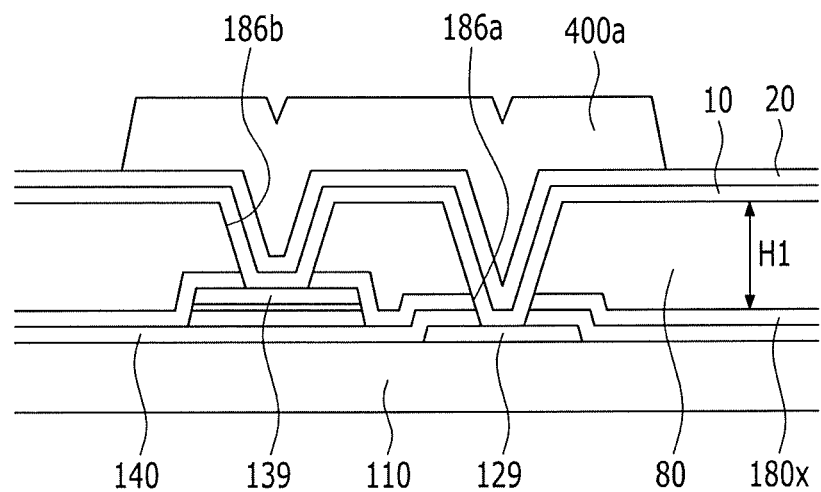
Figure 18:
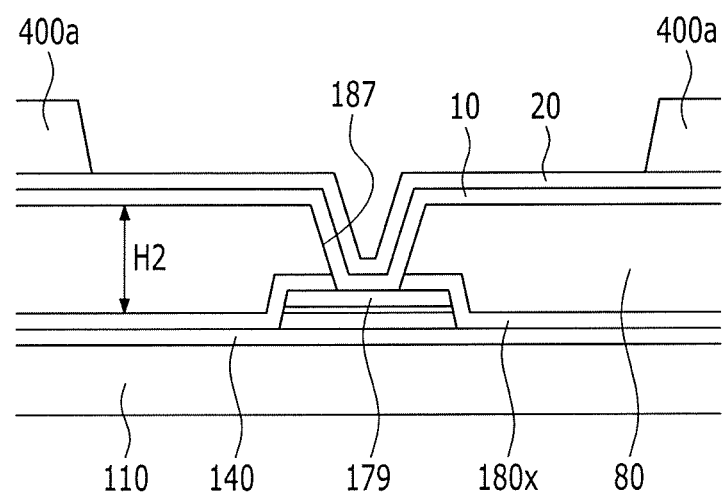

Referring to FIG. 16 to FIG. 18, the photosensitive film 400 is printed and developed to form a photosensitive film pattern 400a. In this case, the photosensitive film pattern 400a is formed in an area corresponding to a location where the second passivation layer 180y is formed.

Figure 19:
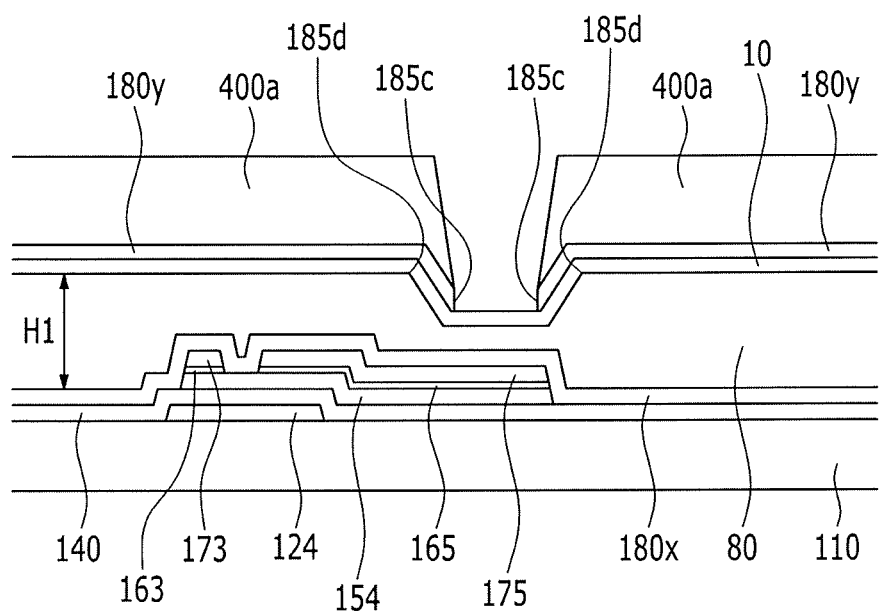
Figure 20:
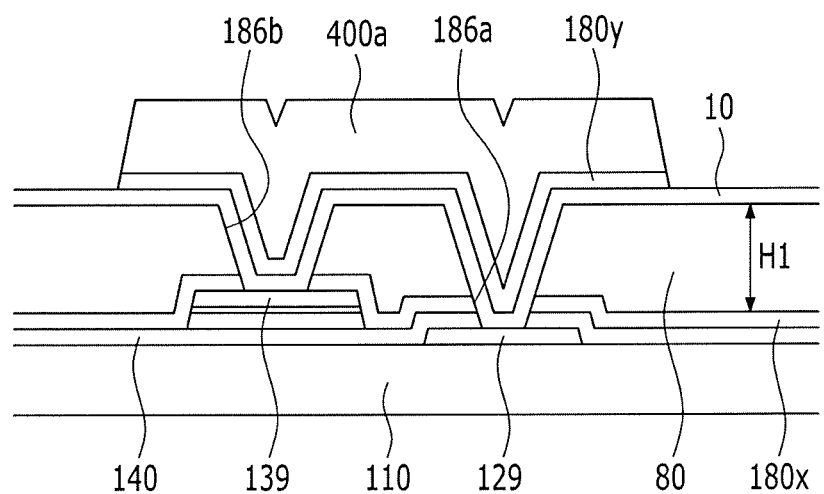
Figure 21:
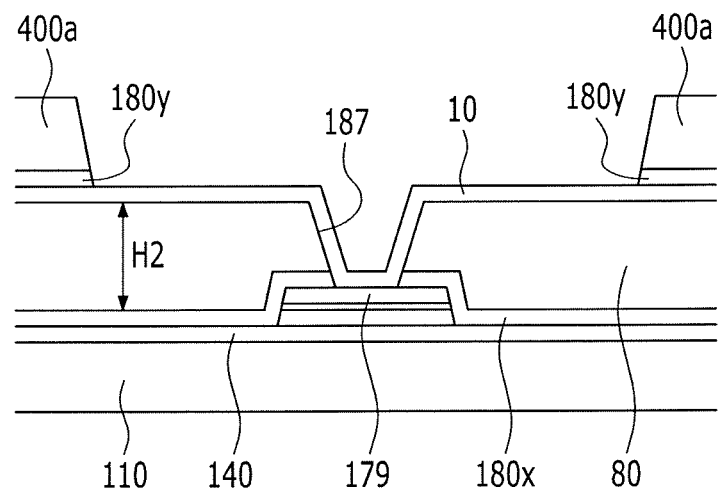

Referring to FIG. 19 to FIG. 21, the second passivation layer 180y is formed by, for example, dry-etching the second layer 20 using the photosensitive film pattern 400a as an etching mask. The third drain contact hole 185c is formed in the second passivation layer 180y, and the second passivation layer 180y has the second edge E2.

Figure 22:
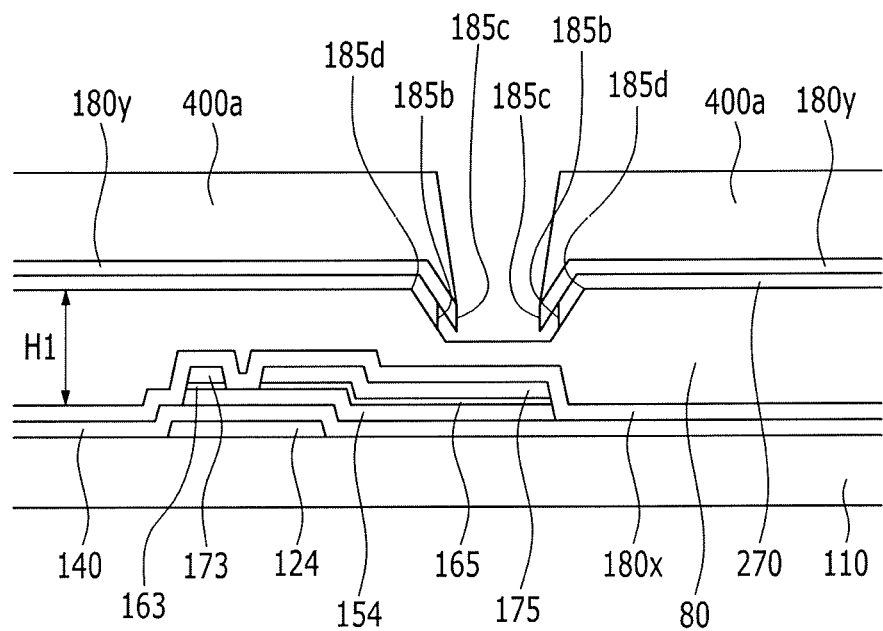
Figure 23:
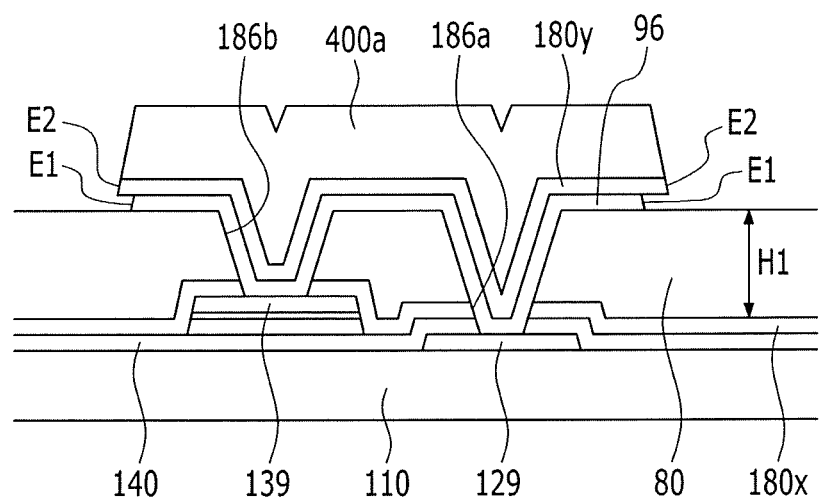
Figure 24:
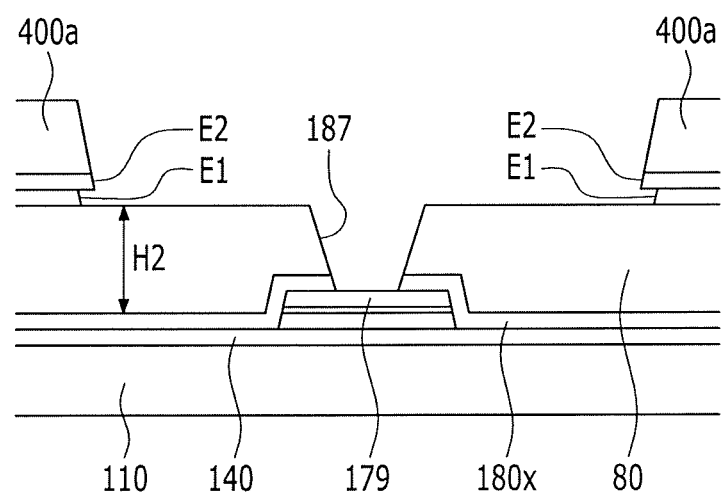

As shown in FIG. 22 to FIG. 24, the first layer 10 is, for example, wet-etched using the photosensitive film pattern 400a as an etching mask, but it is over-etched so as to form the common electrode 270 and the connection member 96 each having the first edge E1 that is less extended than the second edge E2 of the second passivation layer 180y. In this case, the second drain contact hole 185b of which the size and the width are greater than the size and width of the third drain contact hole 185c of the second passivation layer 180y is formed in the common electrode 270.

Figure 25:
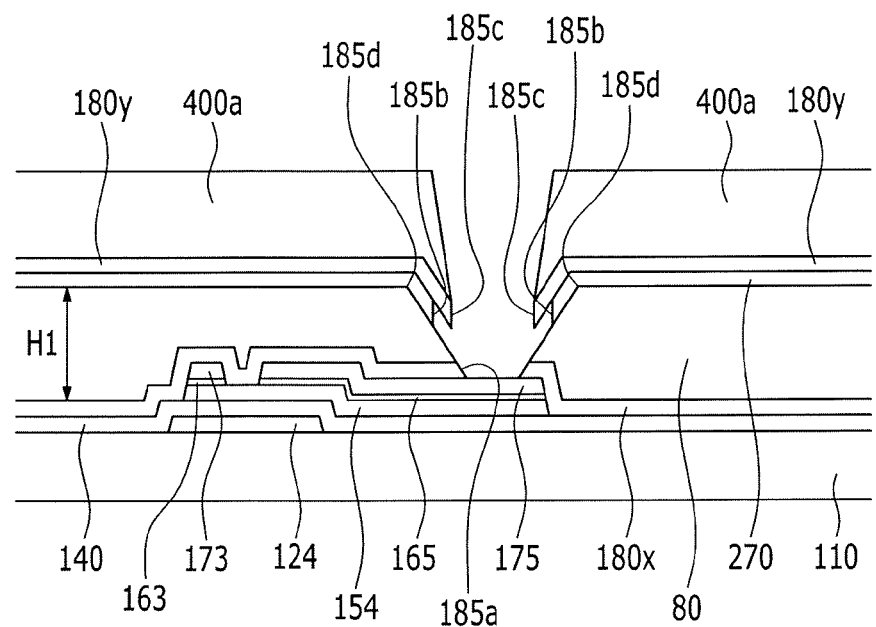
Figure 26:
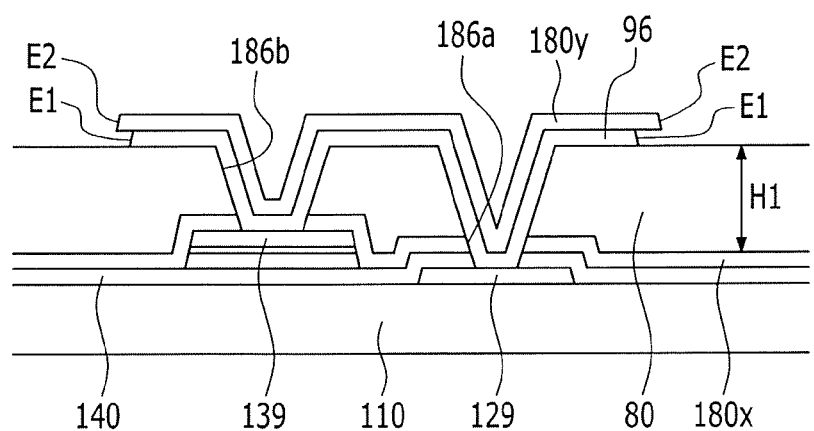
Figure 27:
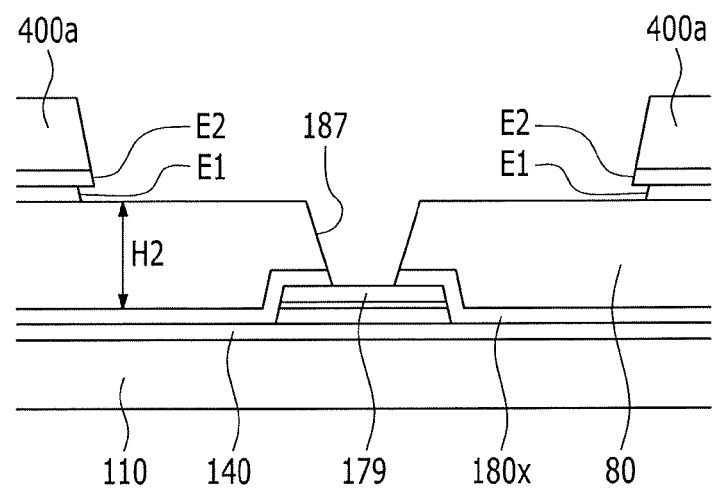

As shown in FIG. 25 to FIG. 27, the organic layer 80 remaining in the location of the first drain contact hole 185a and the first passivation layer 180x are, for example, dry-etched using the photosensitive film pattern 400a as a mask. Accordingly, the first drain contact hole 185a is formed and the drain electrode 175 is exposed.

Figure 28:
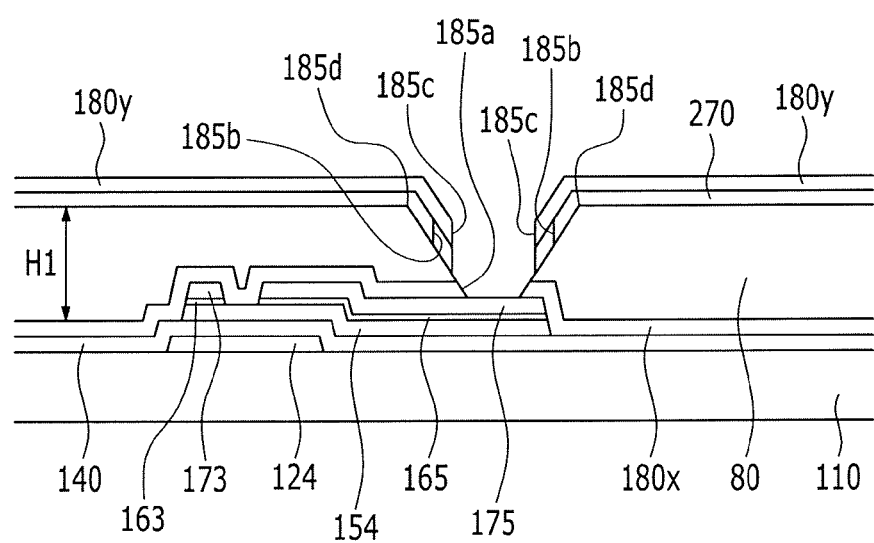
Figure 29:
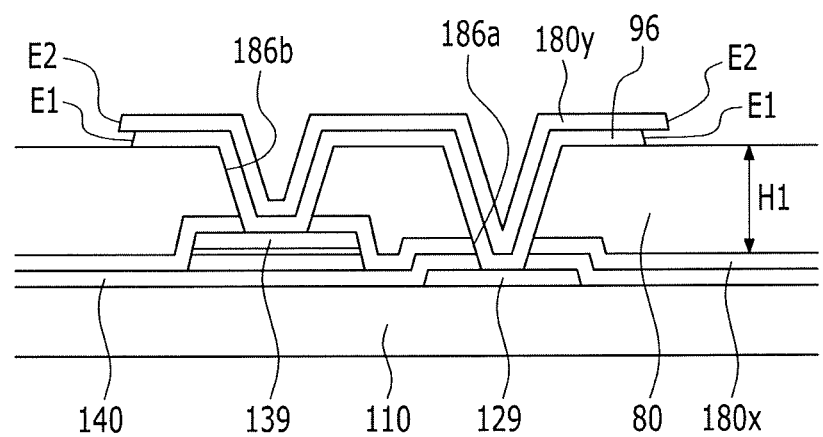
Figure 30:
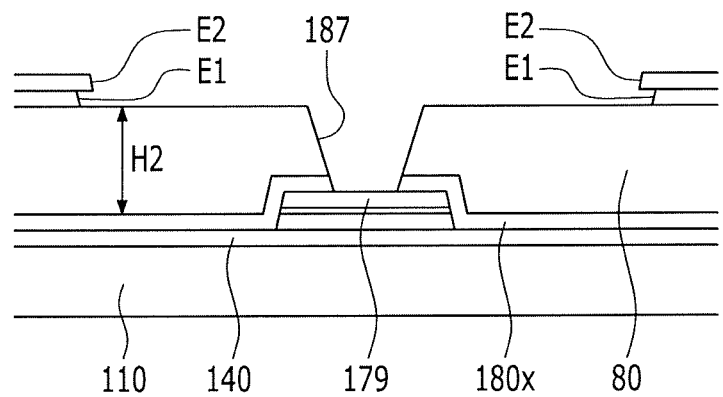

Next, the photosensitive film pattern 400a is removed as shown in FIG. 28 to FIG. 30.

As described, the second passivation layer 180y having the third drain contact hole 185c, the common electrode 270 having the second drain contact hole 185b, the connection member 96, and the first passivation layer 180x having the first drain contact hole 185a may be formed through the etching process using one mask. Then, as shown in FIG. 1 to FIG. 4, the pixel electrode 191 having the fourth thickness T2 and the contact auxiliary member 97 are formed to complete the lower panel 100.

As the second drain contact hole 185b of the common electrode 270 is greater than the third drain contact hole 185c in size and width, the common electrode 270 is not connected with the pixel electrode 191 formed on the second passivation layer 180y. That is, the edge of the second drain contact hole 185b is covered by the edge of the third drain contact hole 185c so that the common electrode 270 is not connected with the pixel electrode 191 formed on the second passivation layer 180y.

In addition, the fourth thickness T2 of the pixel electrode 191 is about two times thicker than the third thickness T1 of the common electrode 270, and thus a short circuit of the pixel electrode 191 due to a step formed in a contact portion by the third drain control hole 185c protruded more than the second drain contact hole 185b can be prevented.

As described, the lower panel 100 is formed first and the upper panel 200 is formed, and then the liquid crystal layer 3 is injected between the lower and upper panels 100 and 200 such that the liquid crystal display is completed as shown in FIG. 1 to FIG. 4.

As shown in FIG. 5 to FIG. 8, if the first drain contact hole 185a is instead formed by wholly exposing the organic layer 80 at a location where the first drain contact hole 185a is formed and the drain electrode 175 is exposed instead of using the halftone mask or slit mask in the exposure process for removal of the organic layer 80 at a location where the first drain contact hole 185a, the first pad contact hole 186a, the second pad contact hole 186b, and the third pad contact hole 187 are formed, then the first layer 10 formed of the transparent conductive layer in FIG. 13 to FIG. 15 would be deposited while contacting the drain electrode 175. After that, the photosensitive film pattern 400a may be formed as shown in FIG. 16 to FIG. 18, and the second passivation layer 180y may be formed through dry-etching using the photosensitive film pattern 400a as an etching mask as shown in FIG. 19 to FIG. 21, and the common electrode 270 and the connection member 96 may be formed through, for example, wet-etching using the photosensitive film pattern 400a as an etching mask as shown in FIG. 22 to FIG. 24. If a misalignment occurs during a process for forming the photosensitive film pattern 400a, the common electrode 270 still remains in the state that it contacts the drain electrode 175 after the common electrode 270 and the connection member 96 are formed through wet-etching, and thus a short circuit may occur between the common electrode 270 and the pixel electrode 191. Therefore, a margin is needed in the process for forming the second passivation layer 180y by forming the photosensitive film pattern 400a for consideration of the misalignment.

However, in exemplary embodiments of the present invention as shown in FIG. 5 to FIG. 8, the halftone mask or the slit mask is used and thus the organic layer 80 at the location where the first drain contact hole 185a is formed partially remains so that the first layer 10 can be deposited without contacting the drain electrode 175, and accordingly, the common electrode 270 and the drain electrode 175 can be prevented from contacting each other. Thus, a short circuit between the common electrode 270 and the pixel electrode 191 can be prevented without regard to the misalignment in the process for forming the photosensitive film pattern 400a. Therefore, there is no need for designing a margin in the process for consideration of the misalignment in the process for forming the second passivation layer 180y by forming the photosensitive film pattern 400a, and thus the third size and the third width W3 of the third drain contact hole 185c can be reduced as much as the margin. In addition, the organic layer 80 partially remains in the location where the first drain contact hole 185a is formed, and thus when the photosensitive film 400 is layered for forming the photosensitive film pattern 400a, the thickness of the photosensitive film 400 layered on the location where the first drain contact hole 185a is formed can be reduced, and the amount of light and processing time can be reduced in the printing and developing of the photosensitive film 400.

Meanwhile, the width of the light blocking member 220 described in FIG. 1 to FIG. 4 is designed to have a predetermined margin from an edge of the third drain contact hole 185c so as to prevent light leakage in a boundary area of the second passivation layer 180y. When the third size and the third width W3 of the third drain contact hole 185c are reduced, the width of the light blocking member 220 can be correspondingly reduced, and as the width of the light blocking member 220 is reduced, an aperture ratio of the liquid crystal display can be increased.

According to a manufacturing method of a liquid crystal display according to an exemplary embodiment of the present invention, the common electrode 270 and the second passivation layer 180y can be simultaneously formed, thereby preventing an increase in the manufacturing costs of the liquid crystal display. In addition, according to a manufacturing method of the liquid crystal display according to an exemplary embodiment of the present invention, the pixel electrode 191 and the common electrode 270 can be prevented from being connected with each other and a short circuit of the pixel electrode 191 at a stepped portion can be prevented.

Figure 31:
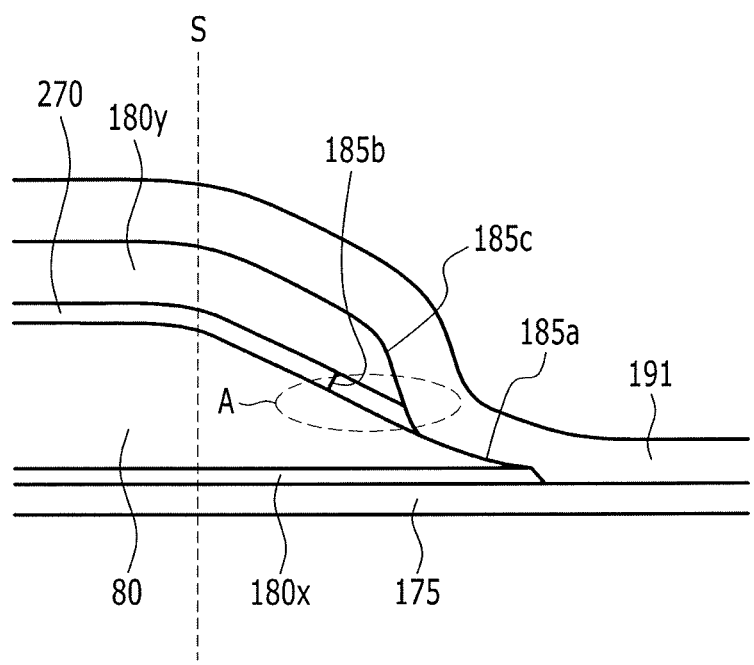
FIG. 31 is a schematic view partially illustrating a liquid crystal display according to an exemplary embodiment of the present invention.

This will be described in further detail with reference to FIG. 31. FIG. 31 is a schematic view that partially illustrates a liquid crystal display according to an exemplary embodiment of the present invention.

Referring to FIG. 31, the second drain contact hole 185b of the common electrode 270 and the third drain contact hole 185c of the second passivation layer 180y are provided in an inclined portion S of the first drain contact hole 185a formed in the organic layer 80. Accordingly, a short circuit of the pixel electrode 191 due to a step formed in a contact portion by the third drain control hole 185c protruding more than the second drain contact hole 185b can be prevented. In addition, the thickness of the pixel electrode 191 is sufficiently thick so that a short circuit of the pixel electrode 191 can be prevented.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A method for manufacturing a liquid crystal display, comprising:
    forming a gate line and a data line on a first substrate and forming a thin film transistor connected to the gate line and the data line;
    forming a first passivation layer and an organic layer on the first substrate;
    forming edges of an inclined portion of the organic layer by partially removing the organic layer to reduce a thickness of the organic layer at a location where a first drain contact hole that exposes a drain electrode of the thin film transistor is formed;
    forming a second passivation layer including a third drain contact hole exposing the drain electrode, a first electrode including a second drain contact hole exposing the drain electrode, and the first drain contact hole through an etching process using one etching mask; and
    forming a second electrode on the second passivation layer,
    wherein the first drain contact hole, the second drain contact hole, and the third drain contact hole overlap with each other,
    wherein a width of the second drain contact hole is larger than a width of the third drain contact hole, and
    wherein a width of a top surface between the edges of the inclined portion is larger than the width of the second drain contact hole.

2. The method for manufacturing the liquid crystal display of claim 1, wherein the edges of the inclined portion is formed through an exposure process using one of a halftone mask or a slit mask.

3. The method for manufacturing the liquid crystal display of claim 1, further comprising:

depositing a first layer formed as a conductive layer on the first substrate after forming the edges of the inclined portion;

depositing a second layer formed as an insulating layer on the first layer; and layering a photosensitive film on the second layer.

4. The method for manufacturing the liquid crystal display of claim 3, wherein the first layer is electrically separated from the drain electrode of the thin film transistor.

5. The method for manufacturing the liquid crystal display of claim 3, further comprising forming a photosensitive film pattern by printing and developing the photosensitive film.

6. The method for manufacturing the liquid crystal display of claim 5, wherein the photosensitive film pattern is formed in an area corresponding to a location where the second passivation layer is formed.

7. The method for manufacturing the liquid crystal display of claim 5, wherein the forming the second passivation layer comprises dry-etching the second layer using the photosensitive film pattern as the etching mask.

8. The method for manufacturing the liquid crystal display of claim 7, wherein the forming the first electrode comprises wet-etching the first layer using the photosensitive film pattern as the etching mask.

9. The method for manufacturing the liquid crystal display of claim 8, wherein the first layer is less extended than the second edge of the second passivation layer due to over-etching of the first layer.

10. The method for manufacturing the liquid crystal display of claim 8, wherein the forming the first drain contact hole comprises dry-etching the partially remaining organic layer and the first passivation layer using the photosensitive film pattern as the etching mask.

11. The method for manufacturing the liquid crystal display of claim 1, wherein an edge of the second drain contact hole and an edge of the third drain contact hole are overlapped with the inclined portion of the organic layer.

12. The method for manufacturing the liquid crystal display of claim 11, wherein the second electrode is connected with the drain electrode through the first drain contact hole, the second drain contact hole, and the third drain contact hole.

13. The method for manufacturing the liquid crystal display of claim 12, wherein a thickness of the second electrode is greater than a thickness of the first electrode.

14. The method for manufacturing the liquid crystal display of claim 13, wherein the thickness of the second electrode is about two times greater than the thickness of the first electrode.

15. The method for manufacturing the liquid crystal display of claim 1, wherein a first edge of the first electrode and a second edge of the second passivation layer have almost the same plane shape as each other.

16. The method for manufacturing the liquid crystal display of claim 15, wherein the second edge of the second passivation layer is protruded more than the first edge of the first electrode.

17. The method for manufacturing the liquid crystal display of claim 1, wherein the first drain contact hole is formed in the first passivation layer and exposes the drain electrode of the thin film transistor.

18. The method for manufacturing the liquid crystal display of claim 17, wherein a size of the first drain contact hole is smaller than the size of the second drain contact hole.

19. The method for manufacturing the liquid crystal display of claim 18, wherein the size of the first drain contact hole is smaller than the size of the third drain contact hole.

* * * * *

UNITED STATES PATENT AND TRADEMARK OFFICE
CERTIFICATE OF CORRECTION

PATENT NO.        : 9,696,602 B2
APPLICATION NO.   : 14/463108
DATED             : July 4, 2017
INVENTOR(S)       : Kwang Bae Park et al.

Page 1 of 1

It is certified that error appears in the above-identified patent and that said Letters Patent is hereby corrected as shown below:

On the Title Page

Item (73) should read:
SAMSUNG DISPLAY CO., LTD.
YONGIN-CITY, GYEONGGI-DO, REPUBLIC OF KOREA Signed and Sealed this
Twenty-fourth Day of July, 2018

Andrei Iancu
*Director of the United States Patent and Trademark Office*